United States Patent [19] [11] 3,737,588

Susi [45] June 5, 1973

[54] HIGH SPEED SEMICONDUCTOR SWITCHING CIRCUIT

[75] Inventor: A. Frederick Susi, Dedham, Mass.

[73] Assignee: GTE Sylvania Incorporated, New York, N.Y.

[22] Filed: Oct. 12, 1971

[21] Appl. No.: 188,165

[52] U.S. Cl. .................................... 179/18 GF
[51] Int. Cl. .................................... H04q 3/50
[58] Field of Search .................................... 179/18 GF; 340/166 R; 307/252 J, 252 K, 305, 252 C; 317/235 Z

[56] References Cited

UNITED STATES PATENTS

| | | | |
|---|---|---|---|
| 3,564,291 | 2/1971 | Aagaard | 307/252 J |
| 3,456,084 | 7/1969 | Haselton | 179/18 GF |
| 3,601,547 | 8/1971 | Potter | 179/18 GF |
| 3,566,154 | 2/1971 | Loessi | 317/235 Z |
| 3,633,052 | 1/1972 | Hanna | 317/235 Z |
| 3,542,963 | 11/1970 | Aagaard | 179/18 GF |
| 3,531,773 | 9/1970 | Beebe | 179/18 GF |
| 3,251,036 | 5/1966 | Smith | 179/18 GF |

*Primary Examiner*—Kathleen H. Claffy
*Assistant Examiner*—Kenneth D. Baugh
*Attorney*—Norman J. O'Malley, Elmer J. Nealon and David M. Keay

[57] ABSTRACT

Crosspoint switching array, each crosspoint switching circuit including silicon controlled switches for connecting signal lines of one group of transmission lines to signal lines of another group. Each switching circuit includes a transistor triggering arrangement connected between control lines of the two groups. Coincident pulses on the control lines cause current to flow in the triggering arrangement thereby switching the silicon controlled switches ON and providing signal paths between the two groups of lines. A leakage resistance is connected between the cathode of each silicon controlled switch and a source of biasing potential so that when the silicon controlled switches are turned OFF, stored charges are rapidly dissipated through the relatively low impedance paths provided by the leakage resistances.

6 Claims, 4 Drawing Figures

HIGH SPEED SEMICONDUCTOR SWITCHING CIRCUIT

BACKGROUND OF THE INVENTION

This invention relates to switching circuits. More particularly, it is concerned with solid state switching circuits for use in crosspoint switching arrays.

Crosspoint switching arrays employing solid state devices have been developed for use in switching networks in communication systems. Switching arrays employing controlled latching semiconductor devices such as silicon controlled rectifiers (SCR) and silicon controlled switches (SCS) are described and claimed in U.S. Pat. No. 3,456,084 entitled "Switching Network Employing Latching Type Semiconductors" issued on July 15, 1969, to Ernest F. Haselton, Jr.

With the advent of techniques for producing monolithic integrated circuit networks within a single body of semiconductor material, it has become desirable to employ switching circuits for crosspoint arrays which are amenable to fabrication as monolithic integrated circuits. Switching circuits which are particularly amenable to fabrication as monolithic integrated circuits are described in patent application Ser. No. 188,166 filed Oct. 12, 1971, by A. Frederick Susi entitled "Switching Circuit" and in patent application Ser. No. 188,164 filed Oct. 12, 1971, by Jerimiah P. McCarthy and William Salmre entitled "Semiconductor Switching Circuit".

Although switching circuits as described in the aforementioned patent and applications operate satisfactorily, it has been found that the switching speed of these circuits is limited. There is a delay in the time required to turn a switching circuit from ON to OFF since controlled latching semiconductor devices store charges while conducting and these charges cause current to continue to flow through the device after forward biasing potentials are removed. Thus a finite amount of time is required to enable the current to decay below the minimum holding current so that the device can be considered as switched OFF.

SUMMARY OF THE INVENTION

Crosspoint switching circuits in accordance with the present invention provide improved high speed switching operation. The crosspoint switching array establishes signal transmission paths between selected transmission line groups of first and second sets of transmission line groups. Each transmission line group of the first set is associated with each transmission line group of the second set at separate ones of a multiplicity of crosspoints, and each transmission line group has at least one signal line and a control line.

The switching array includes a controlled latching semiconductor device, such as an SCR or and SCS, for each signal transmission path between a transmission line group of the first set and a transmission line group of the second set at each crosspoint. Each of the controlled latching semiconductor devices has a first and a second signal electrode and a gate electrode and operates in either a conducting condition or a non-conducting condition. The first and second signal electrodes are connected between signal lines in the first and second sets of transmission line groups. A resistance is connected between the gate electrode and the second signal electrode of each of the controlled latching semiconductor devices.

At each crosspoint there is a triggering means which is adapted to be connected between the control lines in the first and second sets of transmission line groups in order to couple switching pulses occurring across the control lines to the control gate electrodes of the controlled latching semiconductor devices at the crosspoint. When coincident pulses are applied to selected control lines of the first and second sets of transmission line groups, current is caused to flow from the triggering means at the selected crosspoints to the gate electrodes of the associated controlled latching semiconductor devices thereby switching the controlled latching semiconductor devices from the non-conducting condition to the conducting condition and establishing particular signal transmission paths between the selected transmission line groups through those controlled latching semiconductor devices.

A leakage impedance for each controlled latching semiconductor device has one terminal connected to the second signal electrode of the associated device and a second terminal adapted to be connected to a source of reference potential for providing a leakage path for stored charges in the controlled latching semiconductor device when the device changes from the conducting condition to the non-conducting condition. Thus, a leakage impedance removes charges from the associated controlled latching semiconductor device, which charges otherwise would maintain current flow through the device preventing the current from rapidly falling below the minimum holding current for the device. Any attempt to activate controlled latching semiconductor devices at another crosspoint before the minimum holding current has been reached could result in improper device selection and erroneous signal path connections.

BRIEF DESCRIPTION OF THE DRAWINGS

Additional objects, features, and advantages of switching circuits in accordance with the invention will be apparent from the following detailed discussion together with the accompanying drawings wherein.

DETAILED DESCRIPTION OF THE INVENTION

Figure 1:
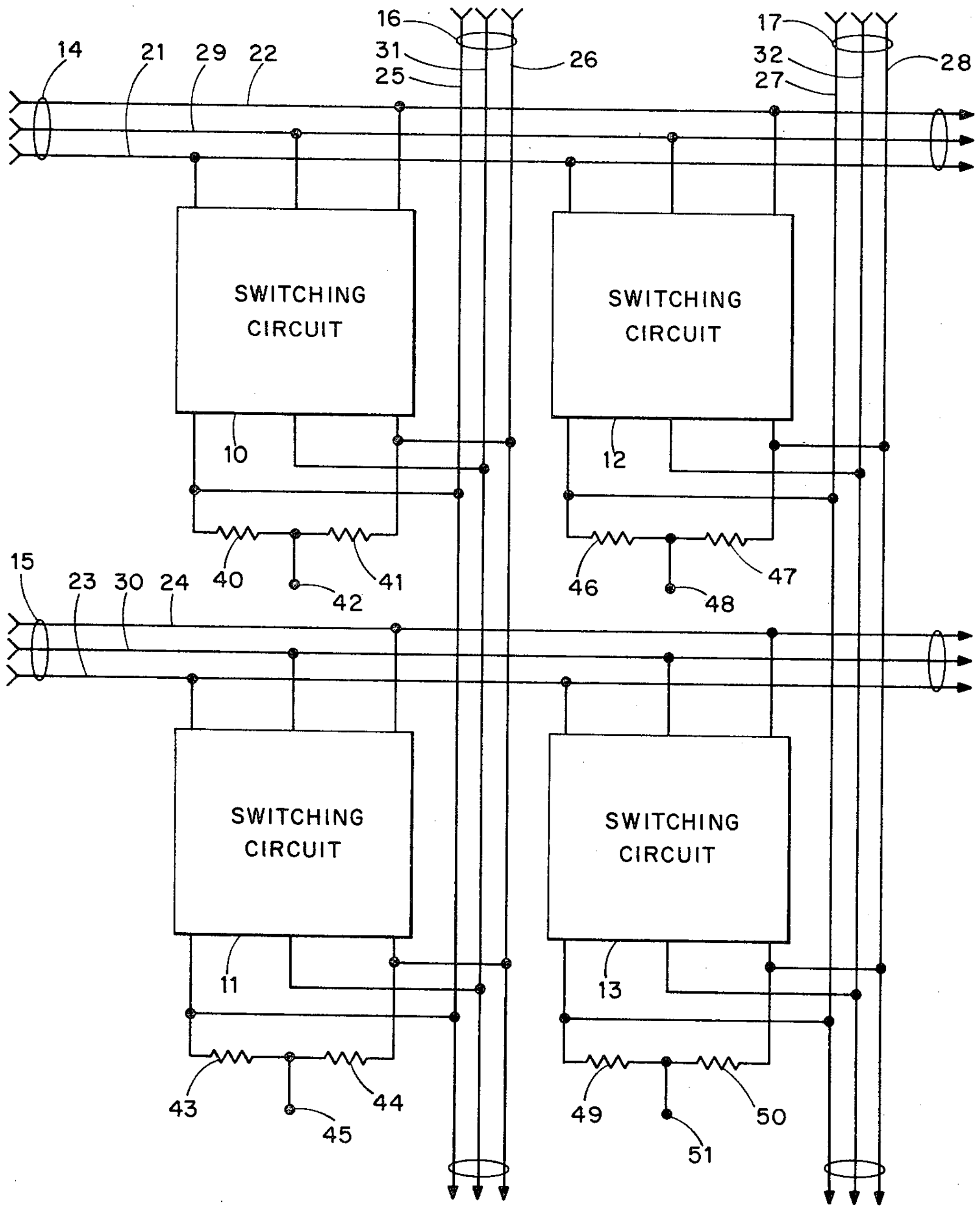
FIG. 1 is a diagram of a 2-by-2 matrix from an array of crosspoint switching circuits in accordance with the present invention.

Shown in FIG. 1 is a switching array which for simplicity is illustrated as a 2-by-2 matrix of switching crosspoints. The crosspoint switching elements 10, 11, 12, and 13 may be fabricated as monolithic integrated circuits in a single body of semiconductor material. With the array as illustrated, either the first or second group of transmission lines 14 and 15 of a first set can be connected to either the first or second transmission line group 16 and 17 of a second set as desired. That is, any transmission line group 14 or 15 of the first set may be connected to any transmission line group 16 or 17 of the second set by activation of the appropriate crosspoint switching circuit 10, 11, 12, or 13. Each of the transmission line groups 14, 15, 16, and 17 as illustrated includes two signal lines 21 and 22, 23 and 24, 25 and 26, and 27 and 28, and a single control line 29, 30, 31, and 32, respectively. Typically, all of the crosspoint switching circuits 10, 11, 12, and 13 of the array are identical.

Leakage resistances 40, 41, 43, 44, 46, 47, 49, and 50 are connected to the output connections from the switching circuits which are connected to the signal lines 25, 26, 27, and 28 of the transmission line groups of the second set. The other terminals of the leakage resistances are connected to terminals 42, 45, 48, and 51. The function of these leakage resistances will be explained in detail hereinbelow.

Figure 2:
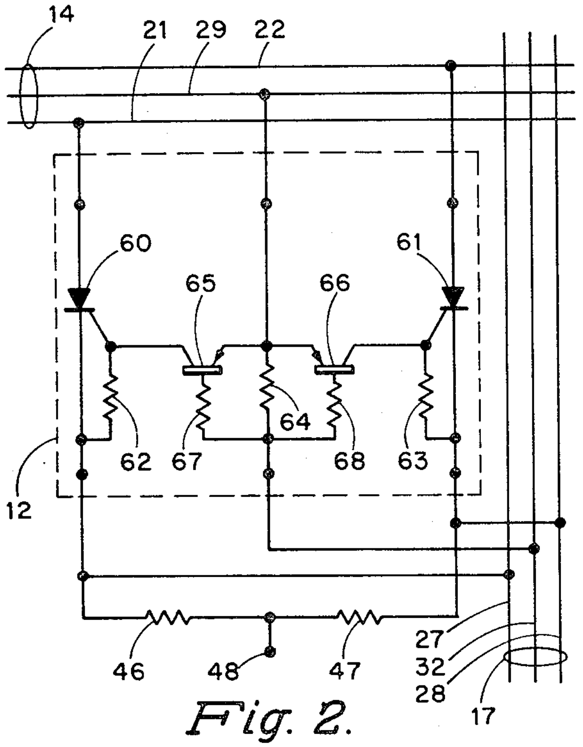
FIGS. 2, 3, and 4 are schematic circuit diagrams of various switching circuits which may be employed as the switching circuits in the crosspoint array of FIG. 1.
Figure 3:
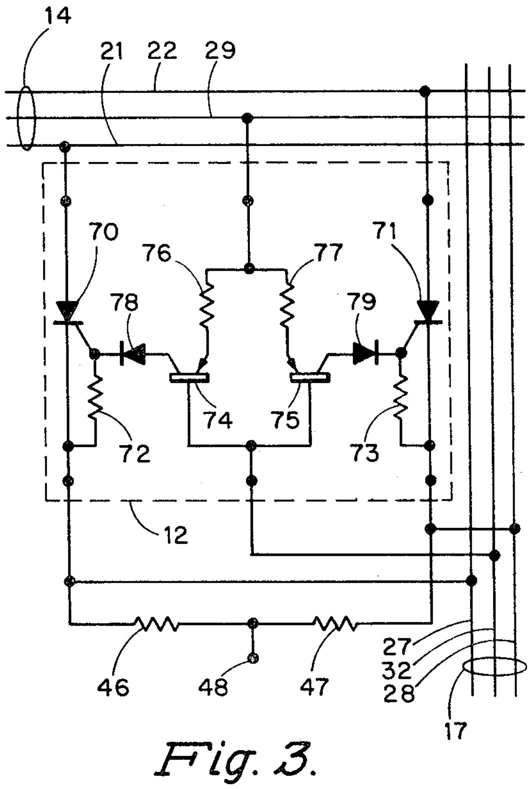
Figure 4:
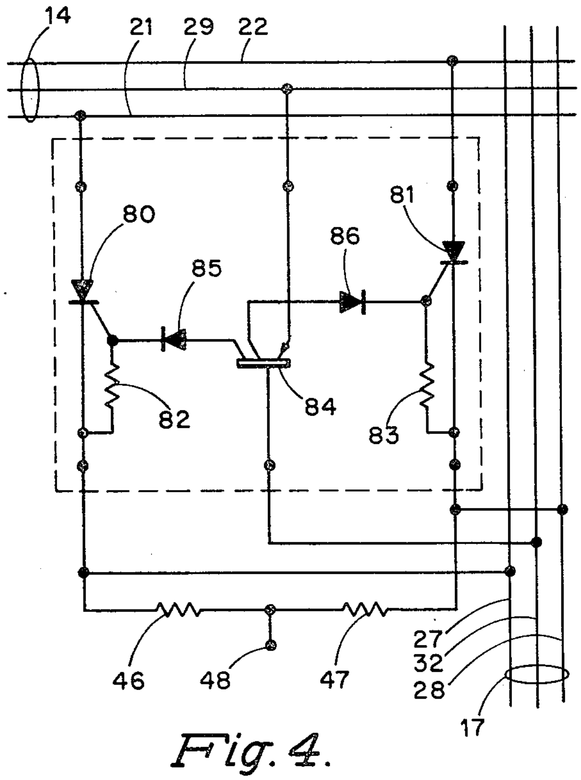

For illustrative purposes, the crosspoint switching circuit 12 of the matrix which when activated serves to connect the first transmission line group 14 of the first set with the second transmission line group 17 of the second set will be described in detail. Examples of different circuits which may be employed as the switching circuit 12 are illustrated in FIGS. 2, 3, and 4. The circuit of FIG. 2 as shown within the dashed lines 12 is described in the aforementioned patent to Haselton. The switching circuit of FIG. 2 includes a first silicon controlled switch (SCS) 60 with its anode connected directly to signal line 21 of the first transmission line group 14 of the first set with its cathode connected directly to signal line 27 of the second transmission line group 17 of the second set. Similarly, a second silicon control switch 61 has its anode connected to the other signal line 22 of the first transmission line group 14 of the first set and its cathode connected directly to the other signal line 28 of the second transmission line group 17 of the second set. A resistance 62 is connected between the control or gate electrode and the cathode electrode of the first silicon controlled switch 60, and a second resistance 63 is similarly connected between the gate electrode and the cathode electrode of the second silicon controlled switch 61.

The control line 29 of the first transmission line group 14 of the first set is connected through a resistance 64 to the control line 32 of the second transmission line group 17 of the second set. A first PNP transistor 65 has its emitter connected to the control line 29, its base connected through a resistance 67 to the control line 32, and its collector connected to the gate electrode of the first silicon controlled switch 60. Similarly, a second PNP transistor 66 has its emitter connected to the control line 29, its base connected through a resistance 68 to the control line 32, and its collector connected to the gate electrode of the second silicon controlled switch 61.

The switching circuit of FIG. 2 operates in the following manner to provide signal paths between the signal lines of the first transmission line group 14 of the first set and those of the second transmission line group 17 of the second set. Under quiescent conditions the silicon controlled switches 60 and 61 are non-conducting and provide a high impedance thus isolating the two transmission line groups from each other. A suitable biasing potential is applied between the signal lines 21 and 27 and between signal lines 22 and 28 by appropriate external circuitry (not shown) to forward bias the silicon controlled switches 60 and 61, respectively, below their breakdown potential. In addition, a suitable reference potential is applied to terminal 48 so as to cause a potential drop across the first silicon controlled switch 60 and leakage resistance 46 and similarly across the second silicon controlled switch 61 and leakage resistance 47.

In order to switch the silicon controlled switches 60 and 61 to their conducting conditions thus establishing signal paths through the switching circuit, momentary pulses are simultaneously applied to control lines 29 and 32, a positive-going pulse on control line 29 and a negative-going pulse on control line 32. The pulses applied to lines 29 and 32 create a potential difference across resistance 64 thereby forward biasing the base-emitter junctions of transistors 65 and 66. The coincident pulses are of sufficient magnitude to forward bias the transistors 65 and 66 into conduction, and current flows to the control electrodes of silicon controlled switches 60 and 61. Since neither of these two pulses alone is sufficient to forward bias the base-emitter junction of a transistor to conduction, none of the transistors in other switching circuits of the array are caused to conduct. Since the silicon controlled switches 60 and 61 are forward biased, the current into the gate electrode triggers the flow of anode-to-cathode current through the silicon controlled switches. The resulting current flow supplied by the external biasing circuitry exceeds the minimum holding current required to maintain the devices in conduction, and thus the silicon controlled switches remain turned ON after termination of the momentary pulses on the control lines. The low impedance of the silicon controlled switches in their conducting condition provides direct paths for signals between the first transmission line group 14 of the first set and the second transmission line group 17 of the second set.

The transmission line groups 14 and 17 are disconnected from each other by resetting the switching circuit to its quiescent condition. Any of various techniques which reduce the current through the silicon controlled switches below the minimum holding current necessary to maintain conduction may be employed. For example, the current supplied by the external biasing circuitry may be interrupted or otherwise reduced to below the level necessary to sustain conduction in the silicon controlled switches.

In any event, as action is initiated to reduce the currents through the silicon controlled switches 60 and 61, stored charges in these device tend to maintain current flow so that the current tends to decay slowly toward zero through an extremely high impedance path provided by the communication system. However, the leakage resistances 46 and 47 provide relatively very low impedance paths to the terminal 48 for these currents so that the stored charges dissipate very quickly. Signal lines 27 and 28 do not themselves provide adequate leakage paths to rapidly dissipate stored charges in the silicon controlled switches, thus without the leakage resistances 46 and 47 current decay below the minimum holding currents of the silicon controlled switches would be relatively slow.

Slow turn-off times of the silicon controlled switches could result in erroneous signal path selections. Current through the silicon controlled switches must drop below the minimum holding current in order to completely disconnect the two transmission line groups and permit them to be connected in other arrangements. If a silicon controlled switch is not completely OFF before a new connection is made, it may inadvertently be restored to ON. Thus, the presence of the leakage resistances 46 and 47 connected to a suitable reference potential at terminal 48 provides for rapid discharge of the stored charges in the silicon controlled switches rapidly dropping the current below the minimum holding current to complete the switching action and permit new connections to be made.

FIG. 3 illustrates a switching circuit 12 as described in the aforementioned application of Susi. In this circuit a first silicon controlled switch 70 has its anode connected to the signal line 21 and its cathode connected to the signal line 27. A second silicon controlled switch has its anode connected to the signal line 22 and its cathode connected to the signal line 28. Resistances 72 and 73 are connected between the gate electrode and cathode of the first and second silicon controlled switches 70 and 71, respectively. First and second PNP transistors 74 and 75 have their emitters connected through resistances 76 and 77, respectively, to the control line 29 and their bases connected directly to control line 32. The collector of the first PNP transistor 74 is connected through a blocking diode 78 to the gate electrode of the first silicon controlled switch 70. The collector of the second PNP transistor 75 is similarly connected through a blocking diode 79 to the gate electrode of the second silicon controlled switch 71.

The circuit of FIG. 3 is also operated with biasing potentials between the signal lines as in the circuit of FIG. 2. Thus, when conincident pulses are applied to the control lines 29 and 32 the transistors 74 and 75 are forward biased to conduction and collector current from the transistors flows into the gate eldctrodes of the silicon controlled switches 70 and 71 switching them from the non-conducting to the conducting condition and establishing transmission paths therethrough to connect the signal lines of the transmission line groups. Similarly, when the silicon controlled switches 70 and 71 are switched to the non-conducting condition the leakage resistances 46 and 47 provide a leakage current path for stored charges from the silicon controlled switches to the potential source connected to the terminal 48.

Another switching circuit 12 which may be employed in the array of FIG. 1 is illustrated in FIG. 4. This circuit is shown and described in the aforementioned application of McCarthy and Salmre. The switching circuit includes two silicon controlled switches 80 and 81 having their anodes connected to signal lines 21 and 22 and their cathodes connected to signal lines 27 and 28, respectively. Resistances 82 and 83 are connected between the gate electrodes and cathodes of the two silicon controlled switches 80 and 81, respectively. A transistor device 84 having a single emitter electrode connected to the control line 29 and a single base electrode connected to control line 32 has a plurality of collector electrodes. One collector is connected through a blocking diode 85 to the gate electrode of the first silicon controlled switch 80 and another collector is connected through a blocking diode 86 to the gate electrode of the second silicon controlled switch 81.

This circuit is also biased similarly to those illustrated in FIGS. 2 and 3 and is activated to connected the two transmission line groups by coincident pulses of opposite polarity applied on the control lines 29 and 32. Current flow in the transistor device 84 causes the silicon control switches 80 and 81 to be switched to the ON or conducting condition establishing signal paths through the circuit. Also, when the silicon controlled switches 80 and 81 are reverse biased to stop conduction therethrough, stored charges leak through the resistances 46 and 47 to the potential source at the terminal 48 thus decreasing the time required to turn the circuit OFF.

Thus, switching circuits for use in crosspoint arrays employing controlled latching semiconductor devices may be operated at increased switching speeds by virtue of the leakage resistances connected between the cathodes of the devices and a suitable source of potential. The value of the leakage resistances is such that there is insignificant loss of signal currents when a circuit is activated providing signal paths between two transmission line groups.

While there has been shown and described what are considered preferred embodiments of the present invention, it will be obvious to those skilled in the art that various changes and modifications may be made therein without departing from the invention as defined by the appended claims.

What is claimed is:

1. A crosspoint switching array for establishing particular signal transmission paths between selected transmission line groups of first and second sets of transmission line groups, each transmission line group of the first set being associated with each transmission line group of the second set at separate ones of a multiplicity of crosspoints, each transmission line group having at least one signal line and a control line; said switching array comprising a controlled latching semiconductor device for each signal transmission path between a transmission line group of the first set and a transmission line group of the second set at each crosspoint, each of said semiconductor devices having first and second signal electrodes and a gate electrode, and having a conducting condition and a non-conducting condition, the first and second signal electrodes being adapted to be connected between signal lines in said first and second sets of transmission line groups;

a resistance for each controlled latching semiconductor device connected between the gate electrode and the second signal electrode of the associated semiconductor device;

triggering means at each crosspoint adapted to be connected between the control lines in said first and second sets of transmission line groups for coupling switching pulses occurring across the control lines to the gate electrodes of the controlled latching semiconductor devices at the crosspoint;

the application of coincident pulses to selected control lines of said first and second sets of transmission line groups causing current flow from the triggering means at the selected crosspoints to the gate electrodes of associated controlled latching semiconductor devices to thereby switch the controlled latching semiconductor devices from the non-conducting condition to the conducting condition and establish particular signal transmission paths between the selected transmission line groups; and a leakage impedance for each controlled latching semiconductor device having one terminal connected to the second signal electrode and a second terminal adapted to be connected to a source of reference potential for providing a leakage path for stored charges in the controlled latching semiconductor device when the controlled latching semiconductor device changes from the conducting condition to the non-conducting condition.

2. A crosspoint switching array in accordance with claim 1 wherein each of said controlled latching semiconductor devices is operable to be biased in the non-conducting condition so as to cause switching to the conducting condition in response to a momentary flow of current to the gate electrode whereby current from the associated triggering means switches the control latching semiconductor device to the conducting condition providing a signal transmission path therethrough.

3. A crosspoint switching array in accordance with claim 2 wherein each triggering means at each crosspoint includes a transistor means having an emitter connection for connecting to the control line of the transmission line group of one of the sets of transmission line groups, a base connection for connecting to the control line of the transmission line group of the other of the sets of transmission line groups, and a collector connection to the gate electrode of each of the controlled latching semiconductor devices at the crosspoint.

4. A crosspoint switching array in accordance with claim 3 including a blocking means connected between the gate electrode of each controlled latching semiconductor device and a collector connection of said transistor means for blocking the flow of current along a path from the signal line connected to the first signal electrode of the semiconductor device, into the semiconductor device, from the gate electrode to tyhe collector connection, through the transistor means, and from the base connection of the transistor means to the control line connected to the base connection.

5. A crosspoint switching array in accordance with claim 4 wherein each transistor means includes a transistor associated with each controlled latching semiconductor device and having its emitter connected to the emitter connection, its base connected to the base connection, and its collector connected through said blocking means to the gate electrode of the associated controlled latching semiconductor device, all current flow between the control lines at the crosspoint being caused to flow across an emitter-base junction of the transistor means thereby causing collector current to flow into the gate electrodes of the controlled latching semiconductor devices at the crosspoint.

6. A crosspoint switching array in accordance with claim 4 wherein each transistor means includes a transistor device having an emitter electrode connected to the emitter connection, a base electrode connected to the base connection, and a separate collector electrode connected through a blocking means to the gate electrode of each of the controlled latching semiconductor devices at the crosspoint, all current flow between the control lines at the crosspoint being caused to flow across the emitter-base junction of the transistor device thereby causing collector current to flow into the gate electrodes of the controlled latching semiconductor devices at the crosspoint.

* * * * *